United States Patent
Narayanan et al.

(10) Patent No.: US 6,596,618 B1
(45) Date of Patent: Jul. 22, 2003

(54) INCREASED SOLDER-BUMP HEIGHT FOR IMPROVED FLIP-CHIP BONDING AND RELIABILITY

(75) Inventors: Kollengode S. Narayanan, Cupertino, CA (US); Mohammad Eslamy, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/016,919

(22) Filed: Dec. 7, 2001

Related U.S. Application Data (60) Provisional application No. 60/254,437, filed on Dec. 8, 2000.

(51) Int. Cl.[7] .................................................. H01L 21/44
(52) U.S. Cl. ........................ 438/612; 438/637; 438/760
(58) Field of Search .......................... 438/612, 613, 438/614, 615, 637, 761, 638, 760

(56) References Cited

U.S. PATENT DOCUMENTS 5,796,589 A * 8/1998 Barrow
5,885,891 A * 3/1999 Miyata et al.

OTHER PUBLICATIONS

R. Tummala et al., Microelectronics Packaging Handbook, Part II, Semiconductor Packaging, (Second Edition, 1997) pp. 152–154.

* cited by examiner

Primary Examiner—David Nelms
Assistant Examiner—Phuc T. Dang
(74) Attorney, Agent, or Firm—Pennie & Edmonds LLP (57) ABSTRACT

The present invention provides a method of forming solder bumps on a semiconductor chip, for flip-chip bonding, having increased height to improve the solder joint reliability of the flip-chip bonded chip and carrier assembly. According to the present invention, a second layer of solder structure is deposited on to each of the solder bump precursor structures formed by a first layer of solder structure to increase the solder-bump volume, which results in solder bumps with increased height.

19 Claims, 7 Drawing Sheets

INCREASED SOLDER-BUMP HEIGHT FOR IMPROVED FLIP-CHIP BONDING AND RELIABILITY

This application claims the benefit of U.S. Provisional Application No. 60/254,437, filed on Dec. 8, 2000.

FIELD OF THE INVENTION

The present invention relates generally to a method of forming solder bumps on an integrated circuit device, typically a semiconductor chip, for mounting the device on a carrier in a flip-chip configuration.

BACKGROUND OF THE INVENTION

Flip-chip bonding is a well-known method of interconnecting integrated circuit devices (also known as semiconductor chips) to carriers. In the flip-chip bonding process, solder bumps are formed on interconnection pads on the active side of an integrated circuit device. The chip is then inverted and bonded to a carrier with a matching set of interconnection pads. The solder bumps form solder joints between the chip and the carrier and provide both mechanical and electrical interconnections.

Typically, the solder bumps are formed on integrated circuit devices by electrolytically plating solder bump precursor structures, typically a PbSn solder, through a photoresist mask. A layer of photoresist is first applied to the active side of a silicon wafer, on which an array of integrated circuit devices have been formed, and cured. Each integrated circuit device is provided with an array of interconnection pads on the active side and the surface of the interconnection pads are provided with finishing metal structure or Under Ball Metallurgy ("UBM," also known as Ball Limiting Metallurgy). The photoresist is then exposed with a pattern of the integrated circuit devices' UBM pads using a photo mask, and developed, resulting in a pattern of holes with a desired diameter exposing the UBM pads on the integrated circuit devices. Next, the solder bump precursor structure is electro-plated onto the exposed UBM pads and the photoresist layer is removed with a chemical stripping process leaving behind an array of columnar solder bump precursor structures on the integrated circuit devices. Finally, the solder bump precursor structures are reflowed to form substantially spherical solder bumps. The particular reflow process is determined by the particular composition of the solder utilized.

Two of the commonly practiced methods for applying the photoresist layer on the semiconductor wafer are a Dry Film Resist ("DFR") process and a spin-coating process. In the DFR process, a dry photoresist film (100 to 125 microns thick) is laminated onto the wafer before it is exposed and developed. In the spin-coat process, a thin film of photoresist is first coated on to the wafer, then, exposed and developed to form a plating mask for the solder bump precursor structure.

One drawback of the solder bump flip-chip bonding technology, particularly when the integrated circuit devices are bonded to polymer printed circuit carriers such as epoxyglass, is the solder joint reliability concerns resulting from the mismatch of the coefficients of thermal expansion ("CTE"s) between the polymer printed circuit carriers and the integrated circuit devices. Typical silicon based integrated circuit devices have a CTE of about 3 ppm/deg. C, in contrast to the CTE of polymer printed circuit carriers, which is about 16 to 26 ppm/deg. C. Because of this mismatch in CTEs, the solder joints experience cyclical stress during the life of its use, as the integrated circuit device and polymer printed circuit carrier assembly is exposed to many thermal excursions as the chip is powered on and off, possibly resulting in fatigue failures of the solder joints.

It is well known in the semiconductor packaging industry that the fatigue reliability of the solder joints in flip-chip bonding application can be improved by increasing the height of the solder joints thereby reducing the strain observed at the solder joints. Since the height of a solder bump is a function of the volume of solder structure plated on a UBM pad and the diameter of the given UBM pad, one method of increasing the solder bump height is to continue plating the solder beyond the thickness of the photoresist plating mask during the solder bump precursor forming process forming a mushroom-shaped extra solder structure on the plating mask. This extra solder increases the volume of the resulting solder bump and, thus, the height of the solder bump. But, the mushroom-shaped as-plated solder structure has a tendency to trap undissolved photoresist material under the mushroom-shaped overhang during the photoresist stripping process. Such photoresist residue can cause solder non-wet or partial-wet joint defects during the flip-chip bonding process. Furthermore, adjacent mushroom-shaped overhangs may contact one another and cause electrical shorting problems if too much additional solder is deposited.

Another possible method of increasing the height of the solder bump is to increase the thickness of the photoresist plating mask so that taller interim solder structures may be plated without the formation of a mushroom-shaped structure. But, as the thickness of the phororesist plating mask is increased, there is a greater tendency for residual photoresist to be left behind in the openings during the photoresist development step.

Another conventional method of forming taller solder bumps is to plate more solder onto larger UBM pads. But increasing the diameter of the UBM pads is not particularly desirable because the trend in the industry is to reduce the pitch of the solder bump arrays in order to accommodate higher level of circuit integration in integrated circuit devices that require greater interconnection densities.

Therefore, a need exists for an improved solder-bump deposition process that will provide increased solder-bump height without the concerns discussed above.

SUMMARY OF THE INVENTION

The present invention provides a method of forming solder bumps on an integrated circuit device for flip-chip bonding. First a photoresist layer is applied over the integrated circuit device. The photoresist layer is patterned with holes aligned over interconnection pads on the integrated circuit device using a photolithography process. Next, a first layer of solder structures is deposited into the patterned holes in the photoresist layer filling the patterned holes with solder. A second layer of solder structures is deposited on top of the first layer of solder structures in a pattern aligned with the patterned holes in the photoresist layer. The second layer of solder structures have smaller diameter than the first layer of solder structures resulting in two-level solder bump precursor structures at the patterned hole locations. The photoresist layer is then removed leaving the two-level solder precursor structures standing. Finally, the two-level solder precursor structures are reflowed to form substantially spherical solder bumps.

In the process described above according to an embodiment of the invention, the second layer of solder may be deposited by printing through a screen or a stencil. In another embodiment of the present invention, the second layer of solder may be deposited by an electroplating process. In the latter case, the process would typically require a formation of another photoresist plating mask layer on top of the first photoresist layer. This second layer of photoresist plating mask would be formed in the same manner as the first photoresist layer with one key difference being that the second photoresist solder mask layer would be formed with patterned holes having smaller diameter than the patterned holes in the first photoresist plating mask layer.

Using the process of the present invention, the as-reflowed solder bump height may be increased by depositing additional solder without creating the mushroom-like solder overhanging structure associated with the prior art processes discussed above. Because the second layer of solder structures have smaller diameter than the first layer of plated solder structures, the second layer of solder does not have any portions that overhang the solder bump precursor structures formed by the first layer of solder. And without the overhanging structure, any residual photoresist concerns resulting from incomplete removal of photoresist material trapped under the overhanging structure is eliminated.

The method of the present invention is also advantageous over the alternative process of depositing more solder on larger UBM pads. With the process of the present invention, as-reflowed height of solder bumps may be increased without increasing the diameter of UBM pads. Consequently, compared to the conventional process of depositing more solder on to larger UBM pads to achieve taller as-reflowed solder bumps, the incremental increase in the solder volume required to achieve the same incremental increase in the as-reflowed solder bump height is less.

The invention will now be illustrated in some specific embodiments in accordance with the invention.

The drawings are only schematic and are not to scale.

DETAILED DESCRIPTION OF THE INVENTION

Figure 1:
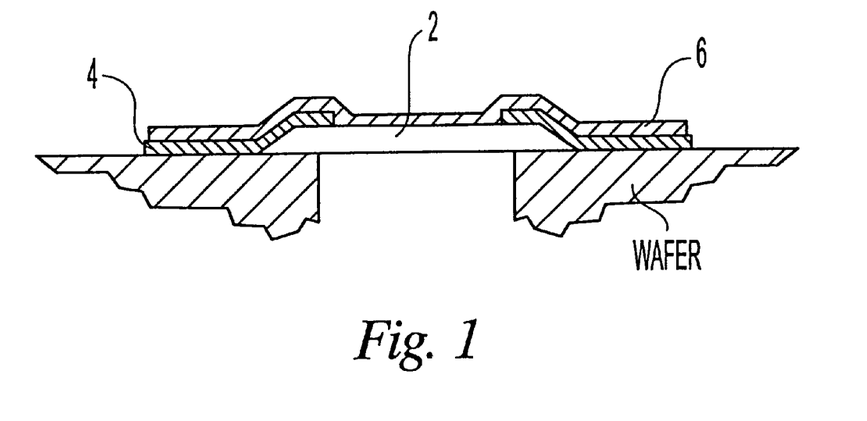
FIG. 1 is a cross-sectional diagram of an interconnection pad on a semiconductor wafer illustrating the structure before a first layer of solder is deposited.

FIGS. 1–5 illustrate the successive stages of an embodiment of the present invention where the second layer of solder structure is deposited in a paste form using a screen or a stencil printing process. FIG. 1 illustrates the structure of a typical interconnection pad on semiconductor chips. The interconnection pad is comprised of an aluminum layer 2 deposited on top of the wafer, a passivation layer 4 protecting the aluminum layer from corrosion, and a UBM pad 6.

Figure 2:
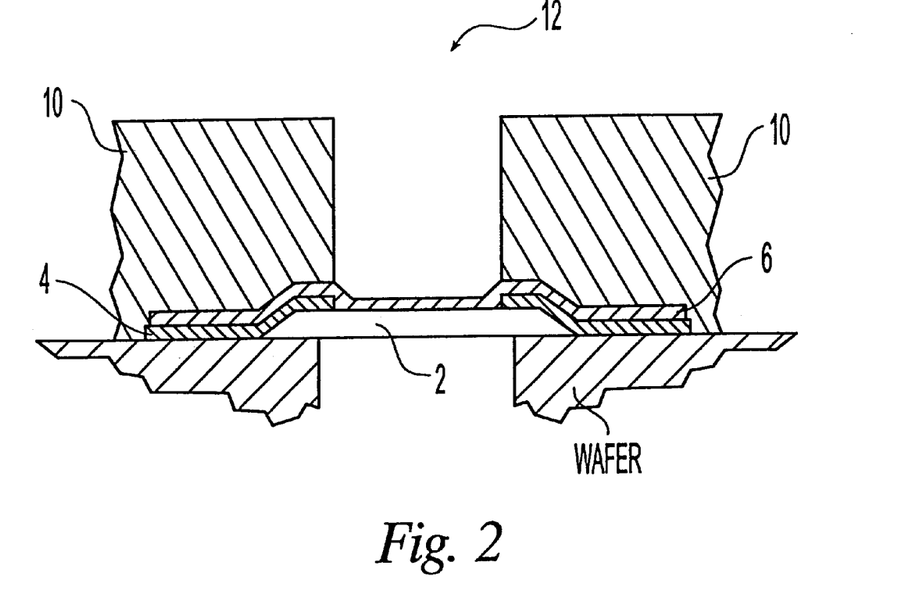
FIG. 2 is a cross-sectional diagram of the interconnection pad of FIG. 1 with a layer of photoresist plating mask.
Figure 3:
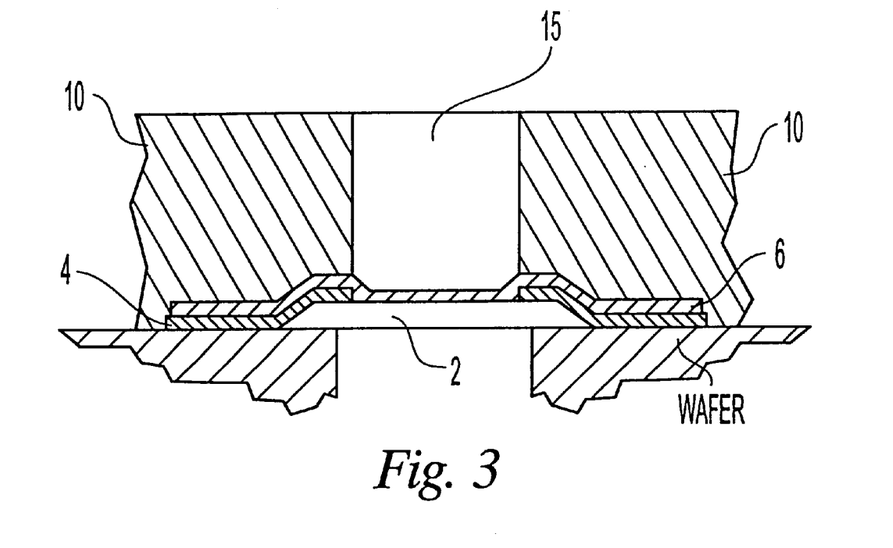
FIG. 3 is a cross-sectional diagram of the interconnection pad of FIG. 2 after a first layer of solder structure has been electro-plated on to the interconnection pad.

In order to deposit the first layer of solder structure, the semiconductor wafer is first coated with a layer of photoresist. The photoresist layer may be applied using one of two methods commonly practiced in the industry. The photoresist may be spin-coated on to the wafer as a thin film or a layer of DFR film may be laminated on to the wafer. In either case, after the layer of photoresist has been applied, a pattern of the interconnection pads is exposed and developed on to the photoresist layer by a photo lithography process using a photo mask and a chemical development process. The result is a layer of photoresist 10 with holes 12 aligned with the UBM pads as illustrated in FIG. 2. The first layer of solder structure is then electroplated on to the UBM pads filling holes 12 in the photoresist. FIG. 3 illustrates the resulting structure of the plated solder 15 and photoresist layer 10.

Figure 4:
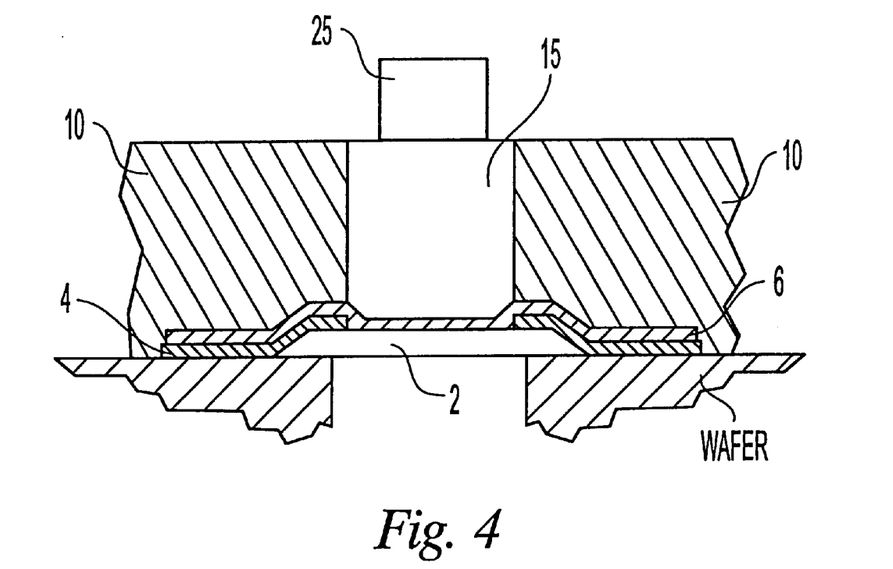
FIG. 4 is a cross-sectional diagram of the interconnection pad of FIG. 3 after a second layer of solder in paste form has been printed on top of the first layer of solder structure.

According to an embodiment of the present invention, a second layer of solder structure 25 may be printed on to the first layer of the plated solder structure 15 resulting in a structure illustrated in FIG. 4. Second layer of solder structure 25 may be printed using a screen or a stencil printing process. In either option, the solder structures formed by the second layer of solder should have smaller diameters than the structures formed by the first layer of solder to prevent the second solder layer structures from over-hanging the first solder layer structures. Depositing smaller diameter solder structures for second layer also accommodates any potential misalignment between the first and second solder layers during the printing process.

Figure 5:
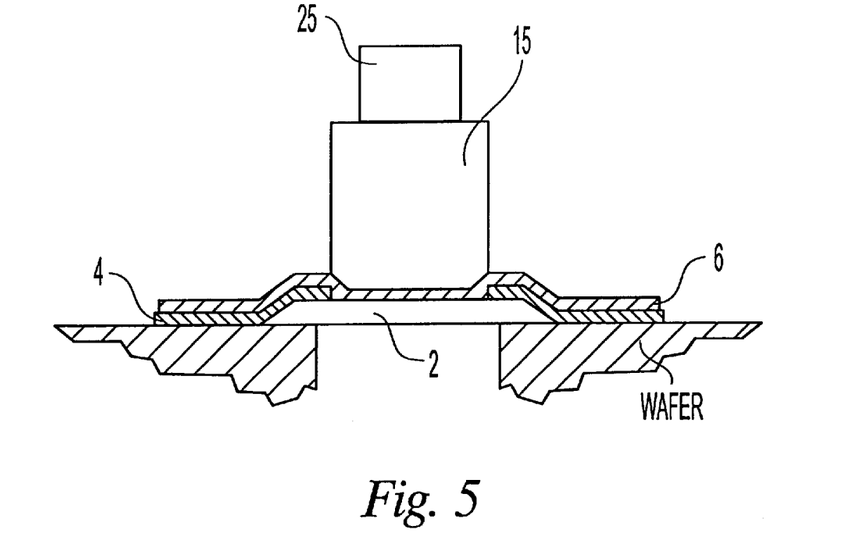
FIG. 5 is a cross-sectional diagram of the interconnection pad of FIG. 4 after the photoresist plating mask has been removed.
Figure 6:
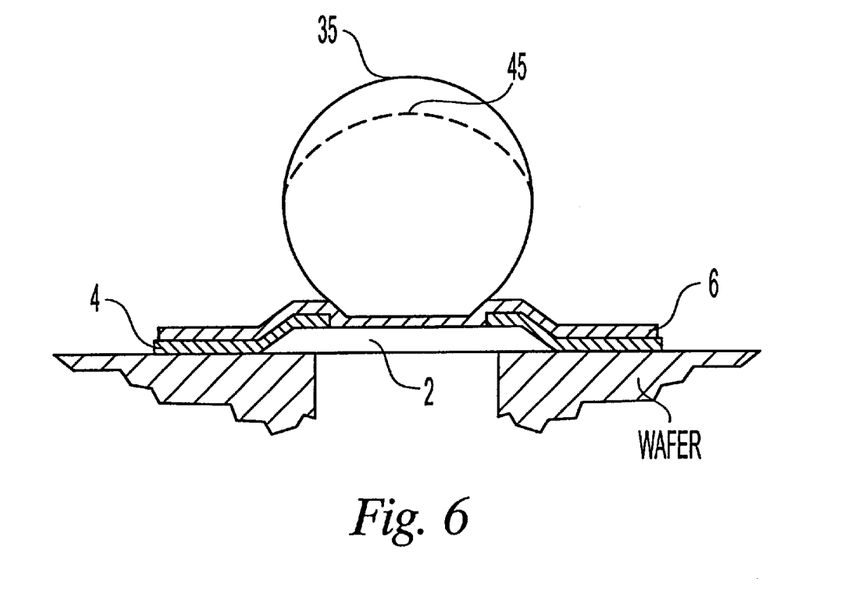
FIG. 6 illustrates the spherical solder bump formed after the as-deposited solder structure has been reflowed.

The photoresist layer 10 is then removed, usually by a chemical stripping process, leaving behind two-level solder bump precursor structures on the UBM pads. FIG. 5 illustrates the two-level solder bump precursor structure formed by first layer solder structure 15 and second layer solder structure 25 on UBM pad 6. The solder bump precursor structures are then reflowed to form solder bumps. The resulting solder bumps 35 have greater height than solder bumps 45 formed with an existing standard process as illustrated in FIG. 6.

Figure 7:
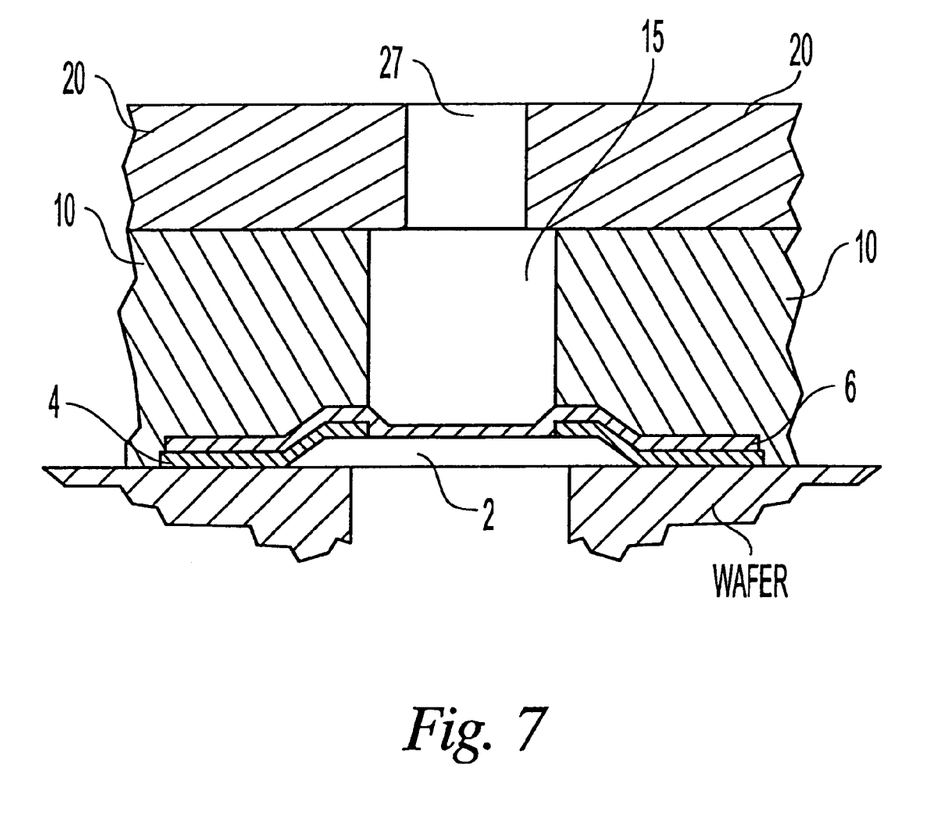
FIG. 7 is a cross-sectional diagram of the interconnection pad of FIG. 3 after being processed through a method according to another embodiment of the present invention, wherein the second layer of solder structure has been electro-plated on to the first layer of solder structure through a second layer of photoresist plating mask.

FIG. 7 illustrates the as-deposited structure of a second solder layer 27 deposited using a method according to another embodiment of the present invention. In this alternate embodiment, the second solder layer 27 is electroplated onto the first layer of solder structure 15. To accommodate the electroplating process for the second solder layer, a second layer of photoresist 20 that is thinner than first photoresist layer 10 is spin-coat applied on top of the first level structure and cured. Alternatively, this thinner second layer of photoresist 20 may be applied using the DFR process described above.

The second photoresist layer 20 is then exposed and developed with the same pattern of holes aligned with the array of UBM pads as used for the first photoresist layer except that the second pattern has smaller diameter holes, resulting in openings in the second layer of photoresist that are smaller in diameter than the solder structures formed by the first layer of plated solder. The second layer of solder 27 is then electroplated onto the first layer of solder structures 15 resulting in the structure illustrated in FIG. 7.

The two photoresist layers 10 and 20 are then removed, usually by a chemical stripping process, resulting in the two-level solder bump precursor structure similar to the one illustrated in FIG. 5. This two-level solder bump precursor structure is then reflowed to form a solder bump 35 illustrated in FIG. 6.

Figure 8:
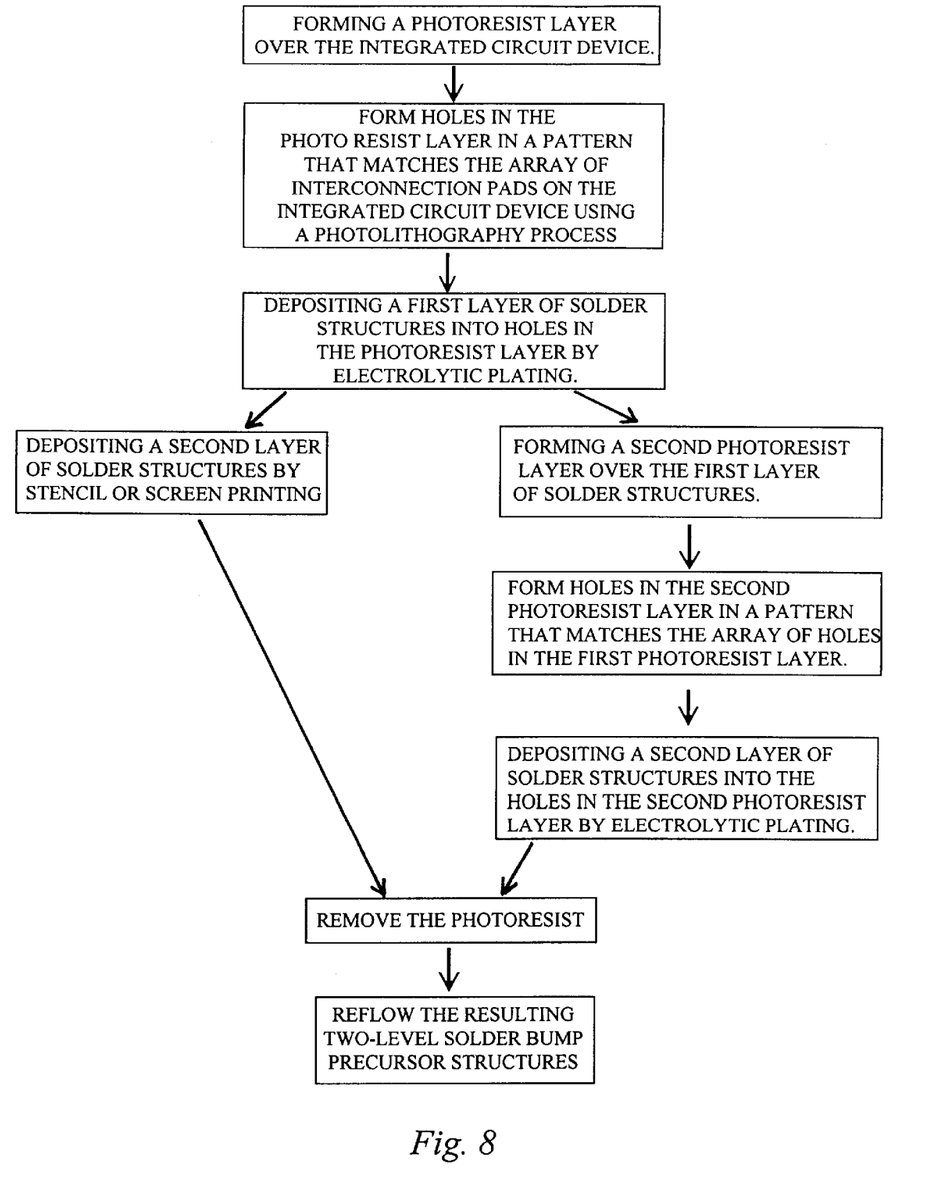
FIG. 8 is a flowchart illustrating the process of an embodiment of the present invention.

FIG. 8 is a flowchart illustrating an embodiment of the process according to the present invention as described above. A photo resist layer is first applied to the integrated circuit device and then a pattern of holes matching the array of interconnection pads on the integrated circuit device is developed in the photoresist layer by a photolithography process. This creates holes in the photoresist layer that exposes the interconnection pads so that the photoresist layer functions as a solder plating mask. Next, the first layer of solder structures is deposited on to the interconnection pads by electrolytic plating.

For depositing the second solder layer structure, there are at least two optional processes available. One is to print the solder in a paste form directly on to the first layer of solder structures using a stencil or a screen. In this process option, the stencil or screen is set up so that the solder paste is deposited on to each of the solder structures in the first layer of solder. This second layer of solder deposited over the first layer of solder structures should have smaller diameter than the first layer of solder structures.

An alternate method of depositing the second layer of solder structures is to use electrolytic plating process similar to the process used to deposit the first layer of solder structures as described above. However the array of holes created in the photoresist plating mask at this step have smaller diameter than the holes that were in the first photoresist plating mask.

Once the second layer of solder structures are deposited using one of the optional processes described above, the photoresist is removed. This may be achieved typically by chemical stripping process. Removal of the photoresist will leave behind two-level solder bump precursor structure sitting on each of the interconnection pads on the integrated circuit device. These precursor structures are then reflowed to form substantially spherical solder bumps.

Figure 9:
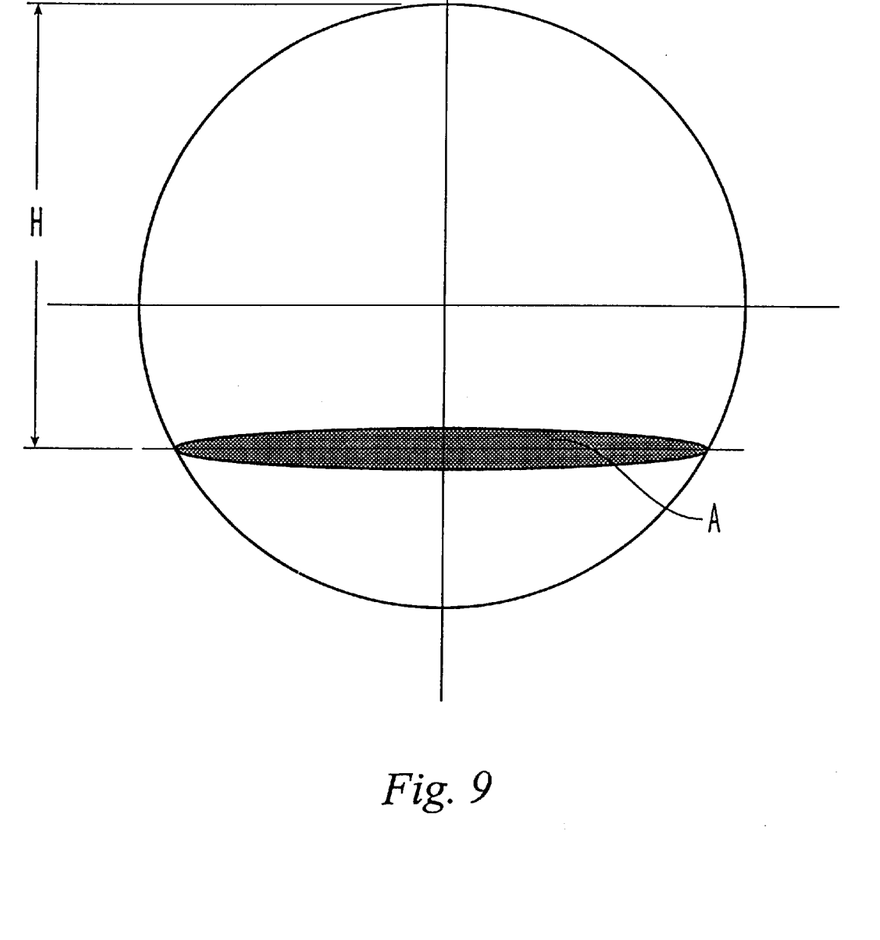
FIG. 9 is a geometrical representation of an as-reflowed solder bump represented as a truncated sphere.

In applying the method of present invention to practice, for an integrated circuit device having UBM pads of a given diameter, one can increase the height of solder bumps to a desired height by depositing a desired additional volume of solder per UBM pad. To calculate the total volume of solder necessary, the as-reflowed solder bump is modeled as a truncated sphere as illustrated in FIG. 9. The relationship between the UBM pad diameter, as-reflowed solder bump height, and the solder volume per UBM pad is expressed by the following equation:

$$\text{Volume} = 0.5 \, (A \times H) + H^3 \, (\pi/6)$$

where A is the area of the UBM pad and H is the height of the as-reflowed solder bump.

FIG. 9 is an X-Y plot of solder volume as a function of UBM pad diameter and as-reflowed solder bump height. As-reflowed solder heights of 90, 100, 110, and 120 $\mu$m are represented. This graph may be used to select an appropriate solder volume to achieve a desired as-reflowed solder bump height. For example, for a UBM pad diameter of 90 $\mu$m, a total solder volume represented by point A on the Y-axis per solder bump will result in the as-reflowed solder bump height of about 90 $\mu$m. If the desired as-reflowed solder bump height is 110 $\mu$m, the volume of the solder deposited per UBM pad should be increased to a value represented by point B on the Y-axis.

Figure 10:
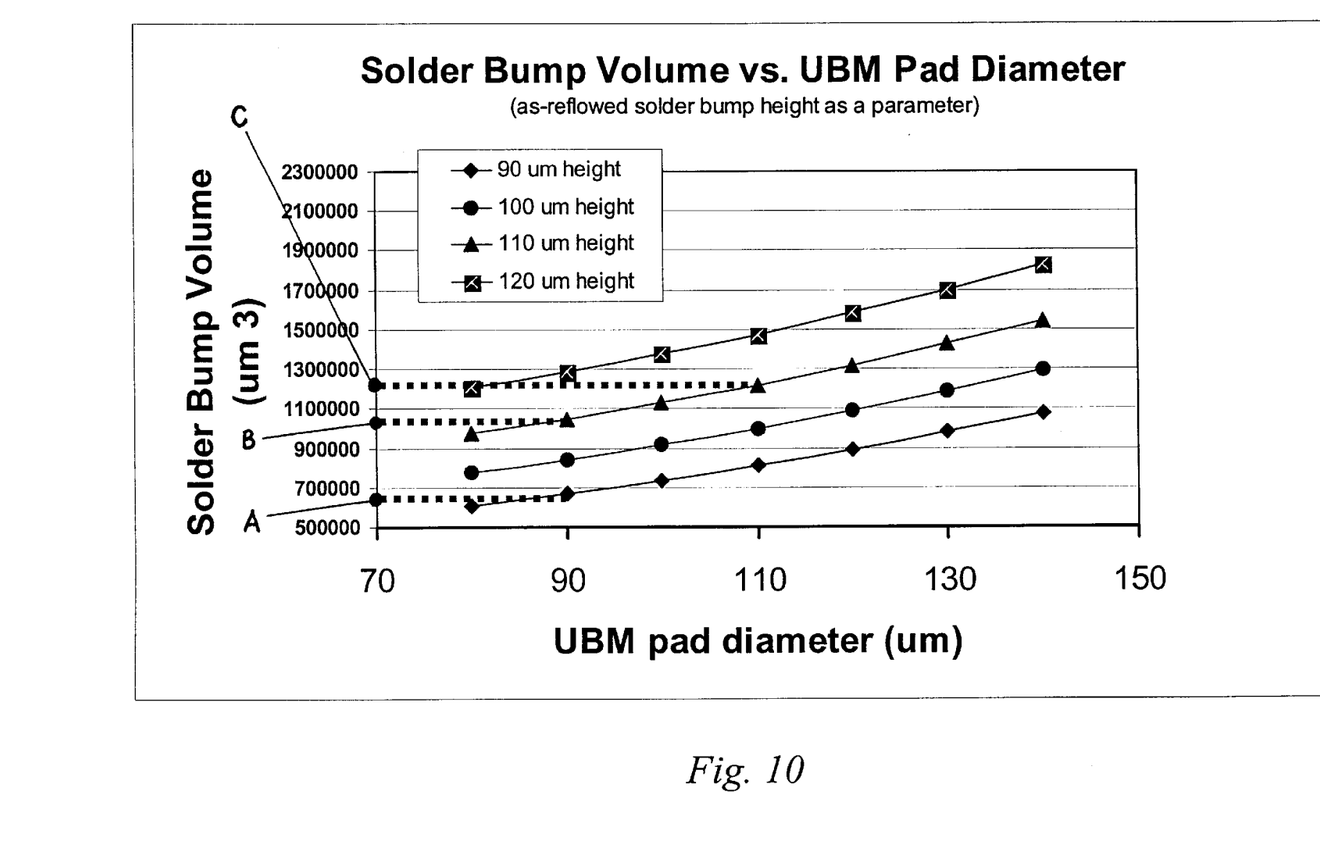
FIG. 10 is an X-Y plot graph illustrating the relationship between the UBM pad diameter, the as-reflowed solder bump height, and the solder bump volume.

The graph of FIG. 10 also illustrates that because the process of the present invention allows increasing the solder volume without increasing the UBM pad diameter, the incremental increase in the solder volume necessary to obtain a given as-reflowed solder bump height is less than that required by the conventional process of using larger UBM pads. For example, to obtain as-reflowed solder bump height of 110 $\mu$m on a UBM pad having a diameter of 90 $\mu$m, a solder volume per UBM pad represented by point B on the Y-axis is required. But to obtain the same solder bump height on a UBM pad having a diameter of 110 $\mu$m, a solder volume per UBM pad represented by point C on the Y-axis is required.

While the present invention has been described with reference to a few specific embodiments, the description is illustrative of the invention and not to be construed as limiting the invention. Various modifications may occur to those skilled in the art without departing from the true spirit and scope of the invention as defined by the appended claims.

We claim:

1. A method of forming solder bumps on an integrated circuit device, comprising:

depositing a first layer of solder structures on to interconnection pads on said integrated circuit device;

depositing a second layer of solder structures on to said first layer of solder structure, wherein said second layer of solder structures have smaller diameter than said first layer of solder structures resulting in two-level solder bump precursor structures on said interconnection pads on the integrated circuit devices; and reflowing said two-level solder bump precursor structures to form substantially spherical solder bumps.

2. A method of forming solder bumps according to claim 1, wherein said first layer of solder structures is deposited on to interconnection pads on said integrated circuit device by electrolytic plating.

3. A method of forming solder bumps according to claim 2, wherein said electrolytic plating process includes forming a layer of photoresist plating mask over said integrated circuit device, wherein said photoresist layer is patterned with holes aligned over interconnection pads on said integrated circuit device and said second layer of solder structures are electrolytically plated on to said interconnection pads.

4. A method of forming solder bumps according to claim 1, wherein said second layer of solder structures is deposited by screen printing.

5. A method of forming solder bumps according to claim 1, wherein said second layer of solder structures is deposited by stencil printing.

6. A method of forming solder bumps according to claim 1, wherein said second layer of solder structures is deposited by electrolytic plating.

7. A method of forming solder bumps according to claim 6, wherein said electrolytic plating process for depositing said second layer of solder structures includes forming a layer of photoresist plating mask over said first layer of solder structures, wherein said photoresist layer is patterned with holes aligned over said first layer of solder structures, wherein said holes have smaller diameter than the first layer of solder structures.

8. A method of forming solder bumps on an integrated circuit device, comprising:

forming a photoresist layer over said integrated circuit device, wherein said photoresist layer is patterned with holes aligned over interconnection pads on said integrated circuit device;

depositing a first layer of solder structures into said holes in said photoresist layer;

printing a second layer of solder structures in paste form on top of said first layer of solder structures in a pattern aligned with said holes in said photoresist, wherein said second layer of solder structures have smaller diameters than said first layer of solder structures resulting in two-level solder bump precursor structures on said interconnection pads;

removing said photoresist layer; and reflowing said two-level solder bump precursor structures to form substantially spherical solder bumps.

9. A method of forming solder bumps according to claim 8, wherein said photoresist layer is formed on said integrated circuit device by laminating a dry photo resist film.

10. A method of forming solder bumps according to claim 8, wherein said photoresist layer is formed on said integrated circuit device by a spin-coat process.

11. A method of forming solder bumps according to claim 8, wherein said first layer of solder structures is deposited by electrolytic plating.

12. A method of forming solder bumps according to claim 8, wherein said second layer of solder is printed by screen printing.

13. A method of forming solder bumps according to claim 8, wherein said second layer of solder is printed by stencil printing.

14. A method of forming solder bumps on an integrated circuit device, comprising:

forming a first photoresist layer over said integrated circuit device, wherein said first photoresist layer is patterned with a first set of holes aligned over interconnection pads on said integrated circuit device;

depositing a first layer of solder structures into said first set of holes in said first photoresist layer resulting in solder bump precursor structures;

forming a second photoresist layer by laminating a dry photoresist film on to said first photoresist layer;

exposing and developing a second set of holes in said second photoresist layer that are in alignment with said first set of holes in said first photoresist layer, wherein said second set of holes in said second photoresist layer are smaller in diameter than said first set of holes in said first photoresist layer;

depositing a second layer of solder structures into said second set of holes in said second photoresist layer resulting in two-level solder bump precursor structures on said interconnection pads;

removing said first and second photoresist layers; and reflowing said two-level solder bump precursor structures to form substantially spherical solder bumps.

15. A method of forming solder bumps according to claim 14, wherein said first photoresist layer is formed on said integrated circuit device by laminating a dry photo resist film.

16. A method of forming solder bumps according to claim 14, wherein said first photoresist layer is formed on said integrated circuit device by a spin-coat process.

17. A method of forming solder bumps according to claim 14, wherein said first layer of solder structure is deposited by electrolytic plating.

18. A method of forming solder bumps according to claim 14, wherein said second layer of solder structure is deposited by electrolytic plating.

19. A method of forming solder bumps according to claim 14, wherein said patterned holes in said first photoresist layer are formed by a photolithography process.

* * * * *